United States Patent
Chu et al.

Patent Number: 5,446,293
Date of Patent: Aug. 29, 1995

[54] RESONANT TUNNELING OPTO-ELECTRONIC DEVICE HAVING A PLURALITY OF WINDOW LAYERS

[75] Inventors: Hye-Yong Chu; Pyong-Woon Park; Seon-Gyu Han; Young-Wan Choi; Gyung-Ock Kim, all of Daejeon, Rep. of Korea

[73] Assignee: Electronics and Telecommunications Research Institute, Rep. of Korea

[21] Appl. No.: 338,117

[22] Filed: Nov. 9, 1994

[30] Foreign Application Priority Data

Dec. 8, 1993 [KR] Rep. of Korea ............... 93-26787

[51] Int. Cl.$^6$ ............... H01L 27/14; H01L 31/00
[52] U.S. Cl. ............... 257/21; 257/24; 257/25; 257/190
[58] Field of Search ............... 257/14, 20, 21, 22, 257/23, 24, 25, 190, 184, 436

[56] References Cited

U.S. PATENT DOCUMENTS 4,929,984  5/1990  Muto et al. ............... 257/25
5,270,225  12/1993  Goronkin et al. ............... 257/25

OTHER PUBLICATIONS

Ozbay et al., "110-GHz Monolithic Resonant-Tunneling-Diode Trigger Circuit", IEEE Electron Device Letters, vol. 12, No. 9, Sep. 1991.

*Primary Examiner*—William Mintel
*Assistant Examiner*—Minhloan Tran
*Attorney, Agent, or Firm*—Larson and Taylor

[57] ABSTRACT

Disclosed is an operation principle and an epitaxial structure of resonant tunneling opto-electronic device. According to the present invention, the photo-generated holes stored in front of the double barrier quantum well structure by light illumination. As a result, a large potential drop occurs in the double barrier quantum well structure. And a peak signal of the opto-electronic resonant tunneling device is generated at a relatively lower voltage illumination to one generated before introducing the light into the device. An amount of photocurrent is $10^3$ times and over as compared to the conventional p-i-n diode because a resonant tunneling current is optically controlled by light illumination. So that, it is possible to drive peripheral circuit without use of additional amplifiers for amplifying an output signal from the opto-electronic device.

4 Claims, 4 Drawing Sheets

RESONANT TUNNELING OPTO-ELECTRONIC DEVICE HAVING A PLURALITY OF WINDOW LAYERS

BACKGROUND OF THE INVENTION

1. Field of the Invention

The present invention relates to an ultra-speed opto-electronic device using a resonant tunneling phenomenon, and more particularly to a resonant tunneling diode in which a peak value in a current-voltage characteristic thereof is changed to a transverse direction with respect to voltage when a light is illuminated into the diode.

2. Description of the Prior Art

In semiconductor industries, high integration of a semiconductor device has achieved dependently upon development of a lithographic technique and the like. However, in case that line width in such a semiconductor device is reduced not exceeding mean free path thereof, unexplainable quantum phenomena in the well-known circuit theory will be found. Therefore, to achieve ultra-speed operation and high integration of such a semiconductor device, development of new devices are required which voluntarily use quantum phenomena acting as obstacles of the conventional semiconductor technique. One of the quantum phenomena is resonant tunneling that electrons in a double-barrier quantum well structure are transported at ultra-speed of $10^{-12}$ sec. and less. Studies for applying such a resonant tunneling phenomenon to a field of semiconductor devices of ultra-speed operation have been made.

FIG. 1 shows general current-voltage characteristic of a conventional resonant tunneling diode. As shown in FIG. 1, such a resonant tunneling diode has a negative differential resistance that only a current signal flowing in the diode is reduced even if an externally applied voltage is increased. For example, current is rapidly increased in the range of 0.1 to 0.25 volt, but the current is rapidly reduced at 0.25 volt or more. Also, when the externally applied voltage becomes 0.4 volt or more, the current is more rapidly increased again. In this current-voltage characteristic curve, a peak signal is generated at approximately 0.25 volt. The negative differential resistance exists in the range of 0.25 to 0.4 volt.

Such a resonant tunneling semiconductor device has a bistability with respect to an arbitrary load line because of the above-described negative differential resistance. This bistability has been applied widely to a memory device, a logic circuit, a high-frequency oscillating device and the like.

In recent years, a p-i-n diode or a p-n junction diode is more frequently used as a photo-detector, a photo-conductor or the like. FIG. 2A shows the construction of a p-i-n diode. In FIG. 2A, a p-region of the diode is electrically connected with a source terminal $V_R$ and an n-region thereof is grounded through a resistor $R_L$. Then, if the p-i-n diode formed thus is biased in reverse direction and a light is illuminated to the p-i-n diode, electron-hole pairs are produced therein as shown in FIG. 2B. That is, electron-hole pairs are produced because the light is absorbed into the p-i-n diode as a semiconductor device. Subsequently, Each of the electron-hole pairs is separated into electron and hole, and the carriers separated thus are moved in the diode. As shown in FIG. 2B, the electron carrier is indicated as "−" symbol, and the hole carrier is indicated as "+" symbol. If a light is absorbed into the diode under bias of reverse direction, electrons separated thus are drifted from the p-region to the n-region therein, but holes are drifted from the n-region to the p-region, as shown in FIG. 2B. As a result, current flows in the diode, and thereby the diode starts to operate.

FIG. 2C shows two characteristic curves of the p-i-n diode. As shown in FIG. 2C, one curve indicated by a dotted line is a current-voltage characteristic curve of the p-i-n device when no light is illuminated to the device, $hv=0$ (where, h is Planck's constant and $v$ is frequency of a light), and the other curve indicated by a solid line is a current-voltage characteristic curve of the p-i-n device which when a light is illuminated to the device, $hv>0$.

Since such a p-i-n diode can be operated under bias of reverse direction, a dark current is set in the range of about several pA to nA, and a photo-current is set within several tens μA, as shown in FIG. 3C. Therefore, to drive peripheral circuits, the above-mentioned current signal from the diode has to be amplified by an amplifier.

In addition, as well-known in the art, quantum efficiency or gain, response time and sensitivity or detectivity act as factors determining characteristics of an opto-electronic device such as photo-detector, photo-conductor, or the like. These factors are determined by generating rate of carriers, generating rate of electron-hole pairs which are produced upon a light being absorbed in the photo-device.

As will be appreciated, the opto-electronic device, such as a photo-detector or a photo-conductor using a p-i-n diode, has the problem of lowering operation speed, as compared to that using quantum phenomenon. Additionally, opto-electronic devices using a carrier transporting phenomenon in multi-quantum well structure are used in the art, but it is difficult to manufacture and reproduce the device because of complicated structure thereof. This causes the problem that yield of opto-electronic devices is relatively lowered.

SUMMARY OF THE INVENTION

It is an object of the present invention to provide a resonant tunneling opto-electronic device and a manufacturing method of the same in which ultra-speed transportation of electrons can be optically controlled so as to utilize the device as a switching device.

It is a further object of the present invention to provide a resonant tunneling opto-electronic device and a manufacturing method of the same in which a quantum phenomenon is embodied so as to drive peripheral circuits without an amplifier.

It is another object of the present invention to provide a resonant tunneling opto-electronic device and a manufacturing method of the same in which most simple structure can be embodied, which uses a resonant tunneling phenomenon.

According to the aspect of the present invention, the resonant tunneling opto-electronic device comprising an n+ type GaAs substrate, an n+ type GaAs buffer layer formed on the substrate; a lower spacer layer having first and second spacers formed sequentially on the buffer layer; a double barrier structure formed on the second spacer and composed of double barriers to decrease a non-resonant tunneling current, and a quantum well formed between the double barriers to increase an amount of a resonant tunneling current; an upper spacer layer formed on the second quantum barrier so as to largely drop an internal voltage therein in accordance with illumination of a light while an external applied voltage is provided to the device; and a plurality of window layers formed on the upper spacer in order that the light is not absorbed in an upper surface of the device and is mostly absorbed in depletion regions to be formed in the spacer layers.

In this device, the device has a negative differential resistance that in case of no illumination of the light a current is reduced even if the externally applied voltage is increased, so as to serve the device as a resonant tunneling diode.

In this device, electron-hole pairs are generated in the device in case that the light is illuminated with energy having a band gap and more of the depletion area, and electrons are transported through the collector and holes are stored just in the collector in front of the double barrier, when the externally applied voltage is provided, so that a first peak voltage produced by the illumination of the light is set lower than a second peak voltage produced upon the light being not illuminated.

In this device, non-resonant tunneling current flows in the device without illumination of a light and, under illumination of a light, the resonant tunneling current is relatively high to the non-resonant tunneling current.

According to another aspect of the present invention, the method of manufacturing a resonant tunneling opto-electronic device comprising the steps of providing an n+ type GaAs substrate; forming an n+ type GaAs buffer layer on the GaAs substrate; sequentially growing first and second GaAs spacers on the buffer layer, the first GaAs Spacer being doped with n type of impurity ions and the second GaAs spacer being undoped; forming a double barrier quantum well structure on the second GaAs spacer, the double barrier quantum well structure having first and second undoped AlAs quantum barrier layers to reduce an amount of a non-resonant tunneling current, and an undoped $In_{0.2}Ga_{0.8}As$ quantum well layer formed between the quantum barrier layers to increase an amount of a resonant tunneling current; growing a third GaAs spacer on the second quantum barrier, the third GaAs spacer being undoped; forming a plurality of window layers on the third GaAs spacer in order that the light is not absorbed in an upper surface of the device and is mostly absorbed in a depletion region of the device.

In this method, the step of forming the buffer layer comprises forming a $2 \times 10^{18} cm^{-3}$ doped n+ GaAs layer having about 10000Å in thickness, and the step of growing the first and second spacers comprises growing a $4 \times 10^{17} cm^{-3}$ doped n-GaAs layer having about 500Å in thickness and an undoped GaAs layer having about 100Å in thickness to form the first and second GaAs spacers.

In this method, the step of forming the double barrier quantum well structure comprises forming the first quantum barrier layer having about 28Å in thickness on the second GaAs spacer, forming the quantum well layer having about 45Å in thickness on the first barrier layer and forming the second quantum barrier layer having about 28Å in thickness on the quantum well layer.

In this method, the third GaAs spacer has about 500Å in thickness.

In this method, the window layers comprise an n-GaAs layer doped gradually from $1 \times 10^{16} cm^{-3}$ to $2 \times 10^{18} cm^{-3}$ and having about 500Å in thickness, an n-$Al_xGa_{1-x}As$ layer doped with $2 \times 10^{18} cm^{-3}$ and increased gradually aluminum composition(x) from 0% to 40% and having about 500Å in thickness, and an n-$Al_{0.4}Ga_{0.6}As$ layer doped with $2 \times 10^{18} cm^{-3}$ and having about 5000Å in thickness.

Since the opto-electronic device has an optically controlled current-voltage characteristic that a negative difference resistance of the device, a current peak-to-valley rate or a voltage peak-to-valley rate, is hardly varied, but the characteristic curve thereof is moved to the transverse direction. By this current-voltage characteristic, the device can be functioned as a switching device possible to be controlled by a light under application of a predetermined voltage.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Hereinafter, the present invention will be described in detail with reference to the attached drawings.

Figure 3:
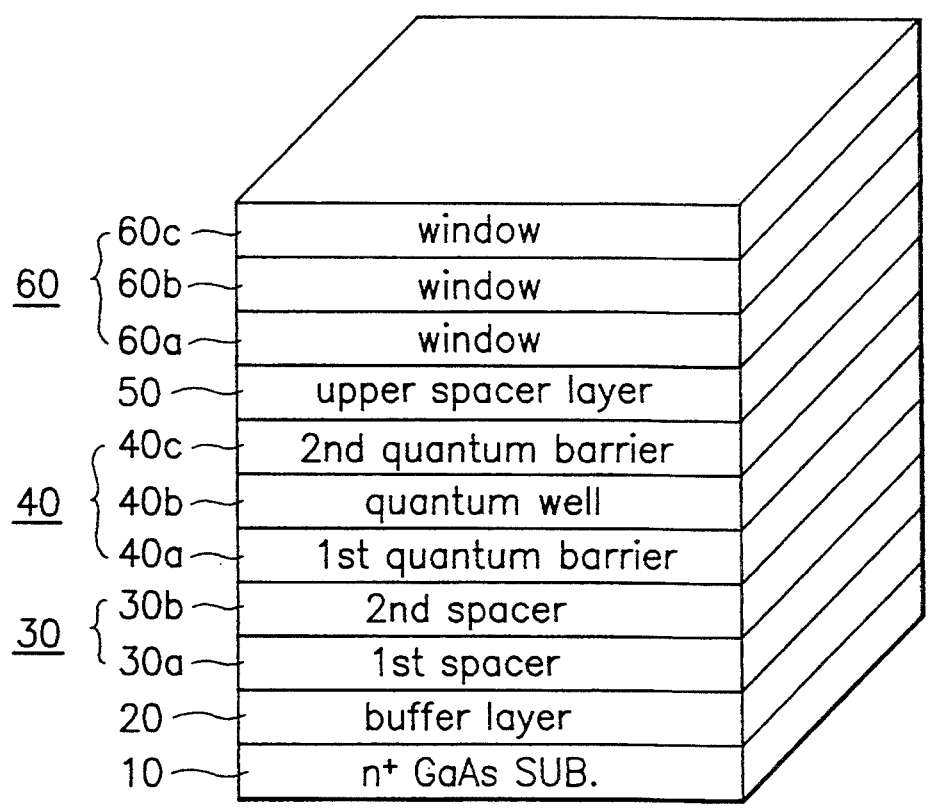
FIG. 3 is a cross-sectional view showing the construction of a resonant tunneling opto-electronic device which is manufactured in accordance with the present invention.

Referring to FIG. 3, the resonant tunneling opto-electronic device of the present invention comprises a double barrier quantum well structure 40 having a double-barrier layer above an n+ GaAs substrate 10. The double barrier quantum well structure 40 is formed between upper and lower spacer layers 30, 50. The double barrier quantum well structure 40 is composed of two quantum barriers 40a, 40c and a quantum well 40b formed between them. The lower spacer layer 30 is formed on an n+ type GaAs buffer layer 20 and is composed of a first and a second spacers 30a, 30b. The upper spacer layer 50 is formed on upper one of the quantum barriers 40a, 40c. Also, on the upper quantum barrier 40c a window layer 60 is formed, which is composed of a plurality of windows 60a, 60b, 60c.

The opto-electronic device of the present invention is manufactured by following steps. In following descriptions, the same components as those of FIG. 3 are represented by the same reference numerals.

Firstly, to form a buffer layer 20 on an n+ GaAs substrate 10, a $2 \times 10^{18} cm^{-3}$ doped n+ GaAs material is grown on the substrate 10 with 10000Å in thickness.

Subsequently, a $4 \times 10^{17} cm^{-3}$ doped n-GaAs material is epitaxially grown on the buffer layer 20 with 500Å in thickness to form a first spacer 30a, and then an undoped GaAs material is grown on the first spacer 30a to form a second spacer 30b. As a result, a lower spacer layer 30 is formed on the buffer layer 20.

Next, the process of manufacturing a double barrier quantum well structure will be described below.

The double barrier quantum well structure 40 uses an undoped AlAs material as material of a double barrier so as to reduce non-resonant tunneling current. Since this undoped AlAs material is high in a barrier height, the non-resonant tunneling current is reduced. On the second spacer 30b, undoped AlAs material is grown to form a first quantum barrier 40a having about 28Å in thickness. Also, an undoped $In_{0.2}Ga_{0.8}As$ material is grown on the first quantum barrier 40a to form a quantum well 40b having about 45Å in thickness. Since the undoped $In_{0.2}Ga_{0.8}As$ layer is formed as the quantum well in the structure, an amount of current therein is largely increased. On the quantum well 40, undoped AlAs material is again grown to form a second quantum barrier 40c having about 28Å in thickness.

Subsequently, on the double barrier quantum well structure, an upper spacer layer 50 and a window layer 60 are sequentially formed. For example, an undoped GaAs material is grown on the second quantum barrier 40c to form the upper spacer layer 50. The upper spacer layer 90 is provided to increase length of a depletion region to be produced therein. Longer the length of the depletion region, larger the internal voltage drop of double barrier quantum well structure caused by illumination of a light.

In additional, on the second spacer layer, the window layer 60 is formed using a material having high band gap in order that a light is not absorbed into a surface of the window layer and can be mostly absorbed into the depletion region. In detail, an n-GaAs material doped gradually from $1 \times 10^{16} cm^{-3}$ to $2 \times 10^{18} cm^{-3}$ is grown on the upper spacer layer 90 to form a first window 60a having approximately 500Å in thickness. Also, an n-$Al_xGa_{1-x}As$ material doped with $2 \times 10^{18} cm^{-3}$ is grown on the first window 60a to form a second window 60b having about 500Å in thickness. The n-$Al_xGa_{1-x}As$ material of the second window is increased gradually aluminum composition from 0% to 40%. Finally, an n-$Al_{0.4}Ga_{0.6}As$ material doped with $2 \times 10^{18} cm^{-3}$ is grown on the second window 60b in thickness to form a third window 60c having about 5000Å. As a result, the window layer 60 having a plurality of windows is formed on the second spacer layer 50.

The operation and current-voltage characteristic of the opto-electronic device of FIG. 3 will be described below.

Figure 1:
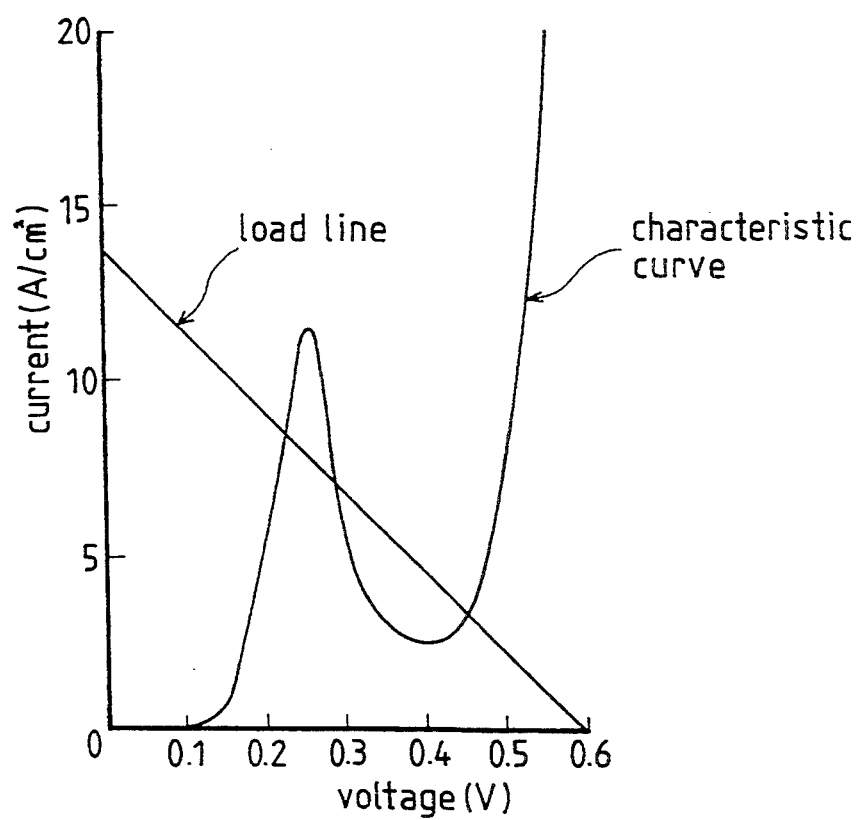
FIG. 1 is a diagram showing a current-voltage characteristic of a conventional resonant tunneling diode.
Figure 2A:
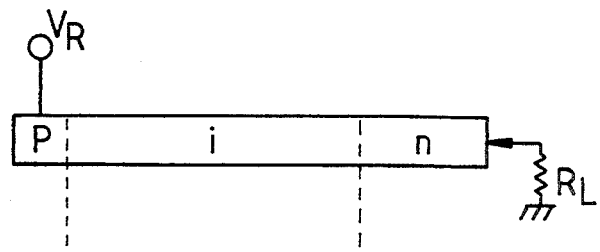
FIG. 2A is a diagram showing the construction of a well-known p-i-n diode.
Figure 2B:
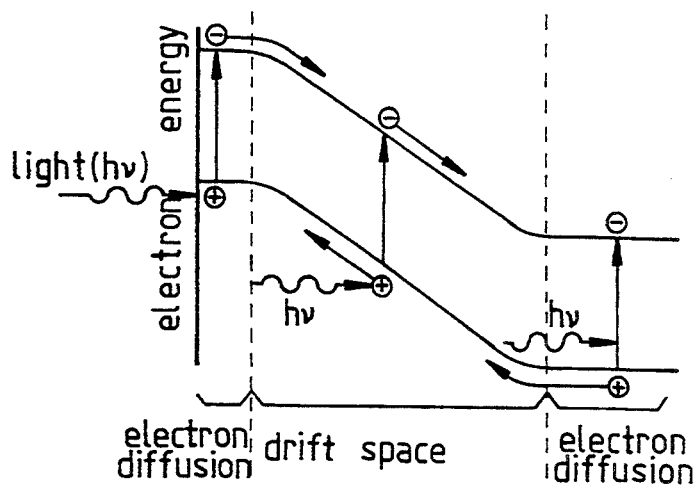
FIG. 2B is a diagram showing drifting operation of electron-hole pair produced upon a light being absorbed in the p-i-n diode as shown in FIG. 2A.
Figure 2C:
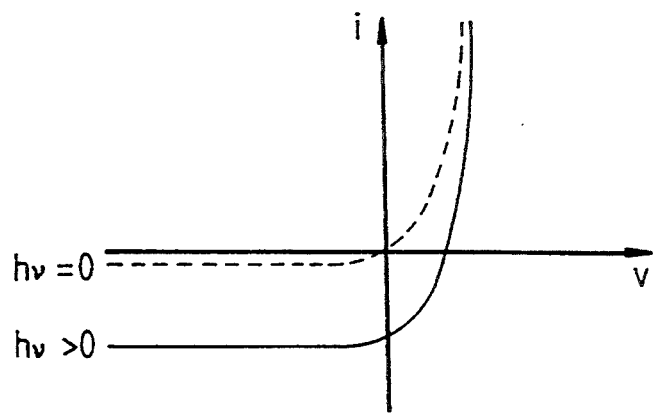
FIG. 2C is a diagram showing current-voltage characteristics of the p-i-n diode.
Figure 4A:
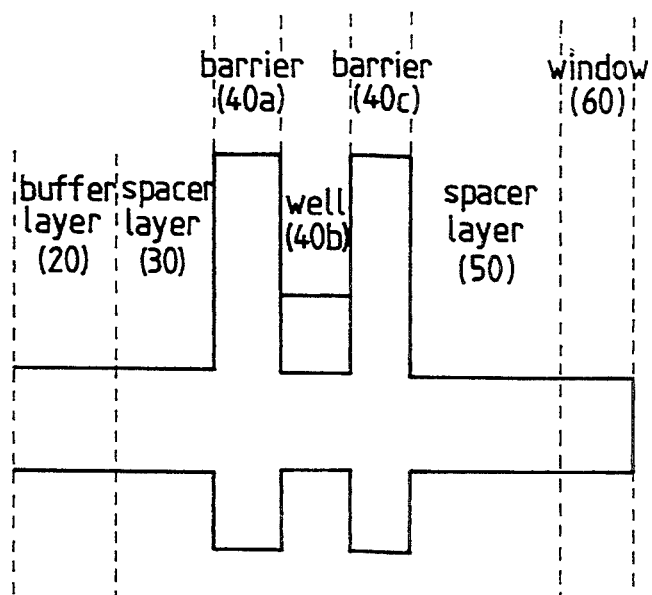
FIG. 4A is a schematic diagram showing a band of the opto-electronic device in case that only an externally applied voltage is applied to the device as shown in FIG. 3.
Figure 4B:
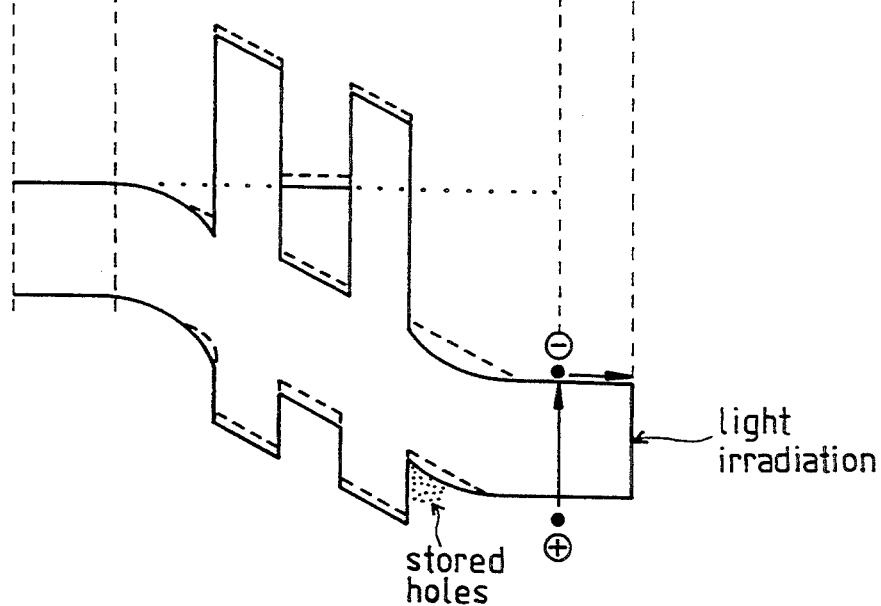
FIG. 4B is a schematic diagram showing a band of the opto-electronic device in case that a light is illuminated to the device under applied bias voltage.

FIGS. 4A and 4B are band diagrams of the opto-electronic device. In FIG. 4A, it is shown in a band diagram that the opto-electronic device comprises a double barrier quantum well structure which has a lower spacer layer 30, a first quantum barrier 40a, a quantum well 40b, a second quantum barrier 40c, and an upper spacer layer 50 arranged in order, when an external voltage signal is not applied to the device. Then, the opto-electronic device functions as a general resonant tunneling diode having a general current-voltage characteristic as shown in FIG. 1. For example, the device of FIG. 3 has a negative differential resistance that an amount of current flowing in the device is reduced within a predetermined voltage range even if a voltage is increased. Also, the device of FIG. 3 has a bistability caused due to the negative differential resistance. Herein, the characteristic that two stable properties exist with respect to one load line is referred as "bistability". Accordingly, when no light is applied, the device of FIG. 3 has the bistability as shown in FIG. 1.

On the other hand, if a light having an energy of a band gap and over is illuminated to a depletion region of the upper spacer layer 50 through the window layer 60, electron-hole pairs are produced in the device, as shown in FIG. 4B. Under production of the pairs, when a voltage is externally applied to the device, each of the electron-hole pairs is separated into electron and hole. Then, the electrons separated thus are quickly transported to a collector (not shown). However, the separated holes are stored in front of the second barrier 40c of the double barrier. As a result, potential distribution of the double barrier quantum well structure is varied, and thereby an electrical characteristic curve is moved to a lower voltage, along x-axis of an I-V characteristic diagram as shown in FIG. 5.

Figure 5:
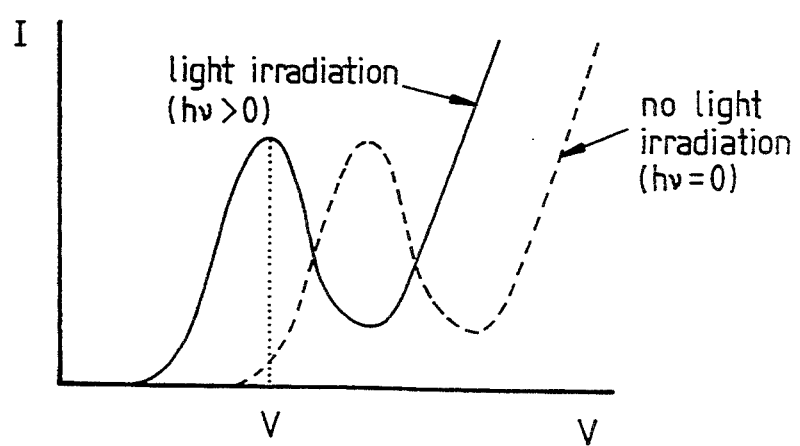
FIG. 5 is a diagram showing current-voltage characteristics of the opto-electronic device of FIG. 3.

FIG. 5 is a diagram showing current-voltage characteristics of the opto-electronic device according to the present invention. In FIG. 5, the characteristic curve indicated by a dotted line is a current-voltage characteristic curve of the device when no light is illuminated to the device, $hv=0$, and the characteristic curve indicated by a solid line is a current-voltage characteristic curve of the device which when a light is illuminated to the device, $hv > 0$. With reference to FIG. 5, the negative difference resistance of the device, a current peak-to-valley rate or a voltage peak-to-valley rate, is hardly varied, but the characteristic curve is moved to the transverse direction (that is, along the x-axis in FIG. 5). In detail, when a light is illuminated, a peak signal of the characteristic curve is generated at a lower voltage, as compared with that of the characteristic curve generated upon no a light being illuminated.

Also, an amount of the characteristic curve movement is dependent upon intensity and wavelength of a light, and the device has a very wide range of wavelength because the device acts on a light having an energy of a band gap and over of the depletion region. Therefore, if the above current-voltage characteristic to a light is applied to a switching device, such a switching device can be switched in response to a light under application of a predetermined voltage.

The device having the above structure has two differences in operation as compared to the conventional p-i-n diode.

Firstly, the opto-electronic device according to the present invention has a current-voltage characteristic that a peak value is changed to a transverse direction with respect to voltage when a light is introduced into the device. By this characteristic, a peak signal is generated at a relatively lower voltage to one generated before introducing the light into the device. In detail, in the opto-electronic device, electron-hole pairs are produced upon a light being absorbed into the device and are separated into electrons and holes as carriers. Then, the electrons transport to a collector, but the holes do not pass through the double barrier to be stored in front of the second barrier. As a result, a large potential drop occurs in the double barrier quantum well structure and the characteristic of the device is changed in accordance with potential distribution.

On the other hand, since in the conventional p-i-n diode each of electron-hole pairs produced by a light is separated into electron and hole only by an externally applied voltage, only an amount of current flowing therein is changed.

Secondly, in the opto-electronic device of the present invention, a non-resonant tunneling current flows before introduction of a light, but a resonant tunneling current flows by a resonant tunneling effect upon a light being introduced in the device. As a result, the resonant tunneling current is increased approximately ten times as compared to the non-resonant tunneling current. If a characteristic that such a resonant tunneling current is optically controlled is applied to an opto-electronic device, a high peak current of several mA to several hundreds mA flows in a double barrier quantum well structure having a double barrier therein. Therefore, since a high current signal can be modulated even by a feeble light in the opto-electronic device of the present invention, it is possible to drive peripheral circuits without use of additional amplifiers for amplifying an output signal from the device.

Furthermore, the device invention having a bistability can be easily manufactured as compared to a conventional multi-quantum well structure device using an optical bistability.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A resonant tunneling opto-electronic device comprising:
    an n+ type GaAs substrate;
    an n+ type GaAs buffer layer formed on the substrate;
    a lower spacer layer having first and second spacers formed sequentially on the buffer layer;
    a double barrier quantum well structure formed on the second spacer to reduce an amount of a non-resonant tunneling current, the structure having first and second barriers functioning as a double barrier, and a quantum well formed between the barriers to increase an amount of a resonant tunneling current;
    an upper spacer layer formed on the second quantum barrier so as to largely drop an internal voltage therein in accordance with illumination of a light while an external applied voltage is provided to the device; and
    a plurality of window layers formed on the upper spacer in order that the light is not absorbed in an upper surface of the device and is mostly absorbed in depletion regions.

2. The device according to claim 1, wherein the device has a negative differential resistance that in case of no illumination of the light a current is reduced even if the externally applied voltage is increased, so as to serve the device as a resonant tunneling diode.

3. The device according to claim 2, wherein non-resonant tunneling current flows in the device without illumination of a light and, under illumination of a light, the resonant tunneling current is relatively high to the non-resonant tunneling current.

4. The device according to claim 1, wherein electron-hole pairs are generated in the device in case that the light is illuminated with energy having a band gap and more of the depletion region, and electrons are transported to a collector and holes are stored just in the depletion region in front of the second barrier, when the externally applied voltage is provided, so that a first peak voltage produced by the illumination of the light is shifted lower than a second peak voltage produced upon the light being not illuminated.

* * * * *